US012645235B2

(12) United States Patent
Mathew et al.

(10) Patent No.: US 12,645,235 B2

(45) Date of Patent: Jun. 2, 2026

(54) VOLTAGE REGULATOR WITH SATURATION PREVENTION

(71) Applicant: Texas Instruments Incorporated, Dallas, TX (US)

(72) Inventors: Rinu Mathew, Bangalore (IN); Harikrishna P, Bangalore (IN); Venkatesh Kadlimatti, Hubli (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 534 days.

(21) Appl. No.: 18/089,433

(22) Filed: Dec. 27, 2022

(65) Prior Publication Data

US 2023/0152828 A1    May 18, 2023

(51) Int. Cl.
*G05F 1/56*         (2006.01)
*H03F 1/30*        (2006.01)
*H03F 3/45*        (2006.01)

(52) U.S. Cl.
CPC ................ *G05F 1/56* (2013.01); *H03F 1/30* (2013.01); *H03F 3/45475* (2013.01); *H03F 2200/129* (2013.01); *H03F 2200/441* (2013.01); *H03F 2203/45116* (2013.01); *H03F 2203/45378* (2013.01)

(58) Field of Classification Search
CPC ..... G05F 1/56; G05F 1/10; G05F 3/02; H03F 3/45475; H03F 1/30; H03F 2200/129; H03F 2200/294; H03F 2203/45116; H03F 2203/45378; H03F 2200/441
USPC .................................................. 330/260, 297
See application file for complete search history.

(56) References Cited

U.S. PATENT DOCUMENTS

2018/0284830 A1 *  10/2018  Yung .......................... G05F 1/66

OTHER PUBLICATIONS

Luria et al., Dual-Mode Low-Drop-Out Regulator/Power Gate With Linear and On-Off Conduction for Microprocessor Core On-Die Supply Voltages in 14 nm, Mar. 2016, IEEE Journal of Solid-State Circuits, vol. 51 (Year: 2016).*

* cited by examiner

*Primary Examiner* — Andrea Lindgren Baltzell
*Assistant Examiner* — Lance Torbjorn Bartol
(74) *Attorney, Agent, or Firm* — Michelle F. Murray; Frank D. Cimino

(57)         ABSTRACT

In described examples, a low dropout voltage regulator includes an input voltage terminal, a resistive element, first and second transistors, an output terminal, a differential amplifier, and first and second saturation prevention circuits. The resistive element is coupled between the input voltage terminal and a gate of the first transistor. The output terminal is coupled to the drain of the first transistor and the source of the second transistor. A first input of the differential amplifier receives a reference voltage, and a second input is coupled to the output terminal. The first saturation prevention circuit provides a first clamp current to the differential amplifier output if the gate-source voltage of the first transistor is less than a first threshold voltage. The second saturation prevention circuit provides a second clamp current to the differential amplifier output if the gate-source voltage of the second transistor is greater than a second threshold voltage.

20 Claims, 11 Drawing Sheets

VOLTAGE REGULATOR WITH SATURATION PREVENTION

CROSS-REFERENCE TO RELATED APPLICATION

This application claims the benefit of and priority to India Provisional Application No. 202141052086, filed Nov. 13, 2021, which is incorporated herein by reference.

TECHNICAL FIELD

This application relates generally to voltage regulators, and more particularly to saturation prevention in low-dropout voltage regulators.

BACKGROUND

In a voltage regulator, the dropout voltage is the difference between the supply voltage and the output voltage. In a low-dropout (LDO) voltage regulator, this difference can be relatively small. For example, an LDO voltage regulator with a 1.7 volt (V) supply voltage might have a 1.5 V output voltage. LDO voltage regulators are DC linear voltage regulators. In some examples, LDO voltage regulators can be used to maintain an approximately constant, low-noise voltage output in response to an unregulated, potentially highly variable supply voltage, such as from a battery.

SUMMARY

In described examples, a low dropout voltage regulator includes an input voltage terminal, a resistive element, first and second transistors, an output terminal, a differential amplifier, and first and second saturation prevention circuits. The resistive element is coupled between the input voltage terminal and a gate of the first transistor. The output terminal is coupled to the drain of the first transistor and the source of the second transistor. A first input of the differential amplifier receives a reference voltage, and a second input is coupled to the output terminal. The first saturation prevention circuit provides a first clamp current to the differential amplifier output if the gate-source voltage of the first transistor is less than a first threshold voltage. The second saturation prevention circuit provides a second clamp current to the differential amplifier output if the gate-source voltage of the second transistor is greater than a second threshold voltage.

BRIEF DESCRIPTION OF THE DRAWINGS

The same reference numbers or other reference designators are used in the drawings to designate the same or similar (structurally and/or functionally) features.

DETAILED DESCRIPTION

Example LDO voltage regulators are provided. Generally, an LDO voltage regulator provides a regulated or target output voltage $V_{OUT}$, controlled in part by feedback of $V_{OUT}$ to various components within the circuit. In some architectures, a voltage regulator can become unresponsive for a duration after a transient load demand is applied and relieved. While unresponsive, the regulator may fail to regulate $V_{OUT}$ within specification. For example, an amplifier (of the regulator) that controls the output voltage may saturate, that is, it may tend toward either of its voltage rails, typically designated $V_{DD}$ and $V_{SS}$, while attempting to equilibrate the output voltage toward a proper regulated value. Further, as transient load demand normalizes, and a regulator reverses from saturation toward normal regulation behavior, the error amplifier takes time to recover from saturation, and $V_{OUT}$ can deviate from the target output voltage in a positive or negative direction. In various following Figures, aspects of LDO voltage regulators are provided, including circuitry directed to reducing certain of these potential negative effects, with such circuitry generally referred to as saturation prevention circuitry.

Figure 1A:
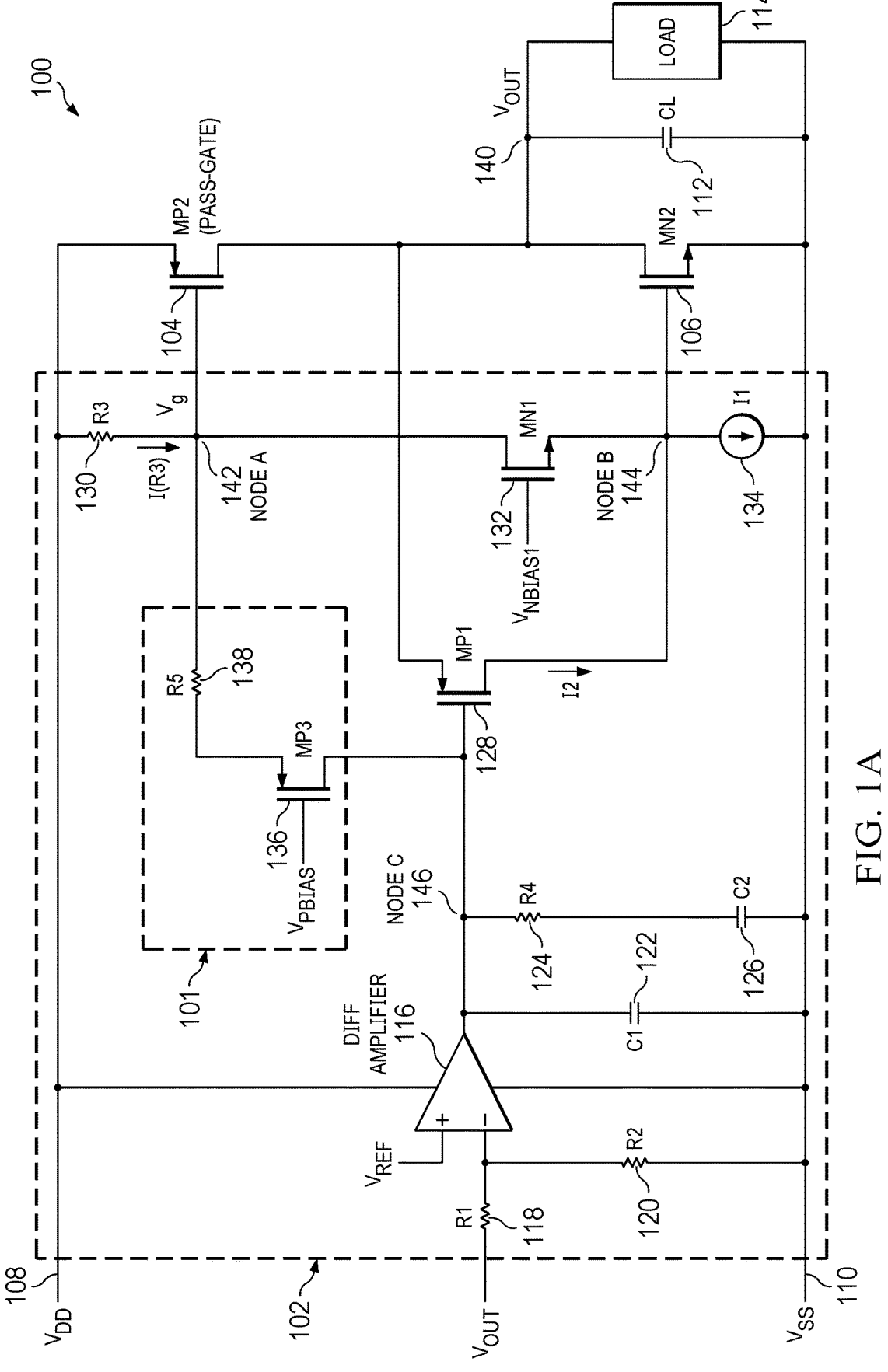
FIG. 1A shows a circuit diagram of an example LDO voltage regulator with a first saturation prevention circuit.

FIG. 1A shows a circuit diagram of an example LDO voltage regulator 100 with a first saturation prevention circuit 101. Herein, resistors are referred to as R[letter or number], and their example resistances are identified in the same manner. Similarly, capacitors are referred to as C[letter or number], and their example capacitances are identified in the same manner. Metal-oxide-semiconductor field-effect transistors (MOSFETs) are identified as M[channel type][number]. Herein, references to gate-source voltage (Vgs) of a MOSFET increasing or decreasing, or being greater than or less than a threshold value, refer to the magnitude of the Vgs increasing or decreasing or being greater than or less than the threshold value. Vgs of a p-channel MOSFET increasing or decreasing means the Vgs becomes more negative or less negative, respectively; Vgs or an n-channel MOSFET increasing or decreasing means the Vgs becomes more or less positive, respectively.

The voltage regulator 100 includes an error amplifier 102, a first p-channel MOSFET (MP2) 104 (referred to herein as the pass-gate 104), a first n-channel MOSFET (MN2) 106, a source voltage ($V_{DD}$) 108, a low voltage reference ($V_{SS}$) 110, a load capacitor (CL) 112, and a load 114. The pass-gate 104 functions as a pass-gate for the voltage regulator 100, as further described below. $V_{SS}$ 110 is, for example, a ground.

The error amplifier 102 includes the first saturation prevention circuit 101, a differential amplifier 116, a first resistor (R1) 118, a second resistor (R2) 120, a first capacitor (C1) 122, a third resistor (R3) 130, a second capacitor (C2) 126, a second p-channel MOSFET (MP1) 128, a second n-channel MOSFET (MN1) 126, a fourth resistor (R4) 124 and a first current source (I1) 134 that provides a first current I1. The first saturation prevention circuit 101 includes a third p-channel MOSFET (MP3) 136 and a fifth resistor (R5) 138. In some examples, a target $V_{OUT}$ is selected by a ratio between R1 and R2.

An output terminal 140 configured to provide a voltage $V_{OUT}$ is connected to the source of MP1 128, the drain of the pass-gate 104, the drain of the MN2 106, a first plate of CL 112, and a first terminal of the load 114. Three nodes are designated to facilitate description of voltage regulation circuits: node A 142, which is connected to a first terminal of R3 130, a first terminal of R5 138, the gate of the pass-gate 104, and the drain of MN1 132; node B 144, which is connected to the drain of MP1 128, the source of MN1 132, the gate of MN2 106, and a first terminal of I1 134; and node C 146, which is at the output of the differential amplifier 116 (and also connected to a first plate of C1 122, a first terminal of R4 124, the drain of MP3 136, and the gate of MP1 128).

Overshoot refers to an increase in $V_{OUT}$ beyond a target voltage. Similarly, undershoot refers to a decrease of $V_{OUT}$ below the target voltage. A magnitude of overshoot or undershoot depends on a response delay of the error amplifier 102. Increased error amplifier delay allows increased overshoot or undershoot. In some examples, overshoot or undershoot is caused by saturation of the error amplifier of the voltage regulator (such as the error amplifier 102) during a load transient. In some examples, the load transient can be caused by a load disconnection or other load release, or, during a full load condition, transition to a no-load condition. Full load refers to a maximum current (limited by design) through the pass-gate 104 (also referred to as a maximum current applied on the LDO voltage regulator 100). In some examples, a full load condition can cause saturation of the voltage regulator. Accordingly, the first saturation prevention circuit 101, a second saturation prevention circuit 201 (see FIG. 2), and a third saturation prevention circuit 402 (see FIG. 4) reduce the chances of these undesirable events.

Returning to the LDO voltage regulator 100 of FIG. 1A, a power terminal of the differential amplifier 116 is connected to $V_{DD}$ 108, and a ground terminal of the differential amplifier 116 is connected to $V_{SS}$ 110. A non-inverting input of the differential amplifier 116 receives a reference voltage $V_{REF}$, such as a reference voltage produced by a bandgap voltage reference. An inverting input of the differential amplifier 116 is connected to a first terminal of R1 118 and a first terminal of R2 120. A second terminal of R1 118 is connected to the output terminal 140 (connection not shown) to receive $V_{OUT}$, enabling a first, relatively slow feedback loop (further described below with respect to FIG. 1B). A second terminal of R2 120 is connected to $V_{SS}$ 110. Together, R1 118 and R2 120 form a resistive voltage divider, so that the voltage at the inverting input of the differential amplifier 116 equals $V_{OUT} \times R2/(R1+R2)$. (Herein, equal means equal to within design and manufacturing tolerances.) Accordingly, the differential amplifier 116 adjusts its output to attempt to set the value of $V_{OUT}$ as shown in Equation 1:

$$V_{OUT} = V_{REF} \times (R1+R2)/R2 \qquad \text{Equation 1}$$

The value of $V_{OUT}$ given by Equation 1 is the regulation voltage that is targeted by the LDO voltage regulator 100. The ideal targeted regulation voltage can be adjusted by adjusting the resistances of one or more of R1 118 and R2 120. A saturation condition occurs when the voltage at the output of the differential amplifier 116 deviates from its operating voltage range towards $V_{DD}$ or $V_{SS}$, which can be caused by the differential amplifier 116 becoming unable to, or unable to otherwise, control $V_{OUT}$ to satisfy Equation 1. Accordingly, the present examples include various circuitry directed toward avoiding, or mitigating the chances or effects of, saturation and overshoot (or undershoot).

An output of the differential amplifier 116 is connected to the first plate of C1 122, the first terminal of R4 124, a gate of MP1 128, and a drain of MP3 136. A second plate of C1 122 is connected to $V_{SS}$ 110. A second terminal of R4 124 is connected to a first plate of C2 126. A second plate of C2 126 is connected to $V_{SS}$ 110.

The differential amplifier 116 can be analyzed as providing an output voltage, for example to bias MP1 128, in response to $V_{REF}$ and the feedback voltage received at the inverting input of the differential amplifier 116. The differential amplifier 116 can also be analyzed as sourcing or sinking an amount of current that can vary from a maximum amount of current sourced to a maximum amount of current sunk. When the differential amplifier 116 settles to an equilibrium, regulated state for a particular load, the current at the output of the differential amplifier 116 equals zero. In response to a change in load conditions affecting $V_{OUT}$, such as a transient load disturbance, the differential amplifier 116 will source or sink current to adjust its output voltage (the voltage at node C 146). The maximum amount of current sourced by the differential amplifier 116 corresponds to the differential amplifier 116 output voltage being saturated to $V_{DD}$ (charging C1 122 and C2 126), and the maximum amount of current sunk by the differential amplifier 116 corresponds to the differential amplifier 116 output voltage being saturated to $V_{SS}$ (discharging C1 122 and C2 126).

A gate of MP3 136 receives a fixed bias voltage $V_{PBIAS}$; for example, a voltage generated internally by an integrated circuit (IC) that includes the LDO voltage regulator 100. $V_{PBIAS}$ is further described later. A source of MP3 136 is connected to a first terminal of R5 138. A second terminal of R5 138 is connected to node A 142 (a first terminal of R3 130, a gate of the pass-gate 104, and a drain of MN1 132). The gate of MP2 104 receives a voltage Vg (gate voltage). A second terminal of R3 130 and a source of the pass-gate 104 are connected to $V_{DD}$ 108. A drain of the pass-gate 104 is connected to a source of MP1 128, a drain of MN2 106, the first plate of CL 112, and the first terminal of the load 114.

A gate of MN1 132 receives a voltage $V_{NBIAS1}$. $V_{NBIAS1}$ is a fixed bias voltage; for example, a voltage generated internally by an integrated circuit (IC) that includes the LDO voltage regulator 100. A drain of MP1 128 is connected to node B 144 (a source of MN1 132, a gate of MN2 106, and the first terminal of I1 134). A second terminal of I1 134, a source of MN2 106, a second plate of CL 112, and a second terminal of the load 114 are connected to $V_{SS}$ 110. MN1 128 is used to regulate a voltage at node B 144 to maintain a designed drain-source voltage of MP1 128.

The LDO voltage regulator 100 is initially described as if the first saturation prevention circuit 101 were not present— that is, as if MP3 136 and R5 138 were replaced with an open circuit. $V_{OUT}$ is regulated by the level of the current through the pass-gate 104. The current level through the pass-gate 104 is determined by the bias voltage Vg of the pass-gate 104. Generally, if $V_{OUT} > V_{REF} \times (R1+R2)/R2$, the output of the differential amplifier 116 to node C 146 tends toward $V_{SS}$. This increases the Vgs of MP1 128, which equals the voltage at node C 146 minus $V_{OUT}$, more readily enabling MP1 128 and ultimately causing $V_{OUT}$ to decrease toward $V_{REF}$. Conversely, if $V_{OUT} < V_{REF} \times (R1+R2)/R2$, the output of the differential amplifier 116 to node C 146 tends toward $V_{DD}$, so that the Vgs of MP1 128 decreases, more readily disabling MP1 128 and ultimately causing $V_{OUT}$ to increase toward $V_{REF}$.

More specifically, the differential amplifier 116 provides a bias voltage to MP1 128 that controls a current through MP1 128 that equals I2. The current from node B 134 towards $V_{SS}$ 110, I1, equals I2 plus a current, I(R3), through R3 130. Further, I(R3) through R3 130 creates a voltage at node A 142, relative to $V_{DD}$ 108, which provides the Vgs to control the resistance/conductivity of the pass-gate 104. The Vgs of the pass-gate 104 equals negative one times the voltage across R3 130.

The above equation for I(R3) can be rearranged as I(R3)= I1−I2. Further, the voltage across R3 130 equals R3×I(R3)= R3×(I1−I2), so that as I(R3) increases, so does the voltage across R3 130, which increases the Vgs of the pass-gate 104, increasing the conductivity of the pass-gate 104. In contrast, as I(R3) decreases, so does the voltage across R3 130, which decreases the Vgs of the pass-gate 104, decreasing the conductivity of the pass-gate 104. The voltage at node A 142 equals $V_{DD}$ minus the voltage across R3 130. Accordingly, the gate voltage Vg of the pass-gate 104 is described by Equation 2:

$$Vg = V_{DD} - R3 \times (I1 - I2) \qquad \text{Equation 2}$$

Figure 1B:
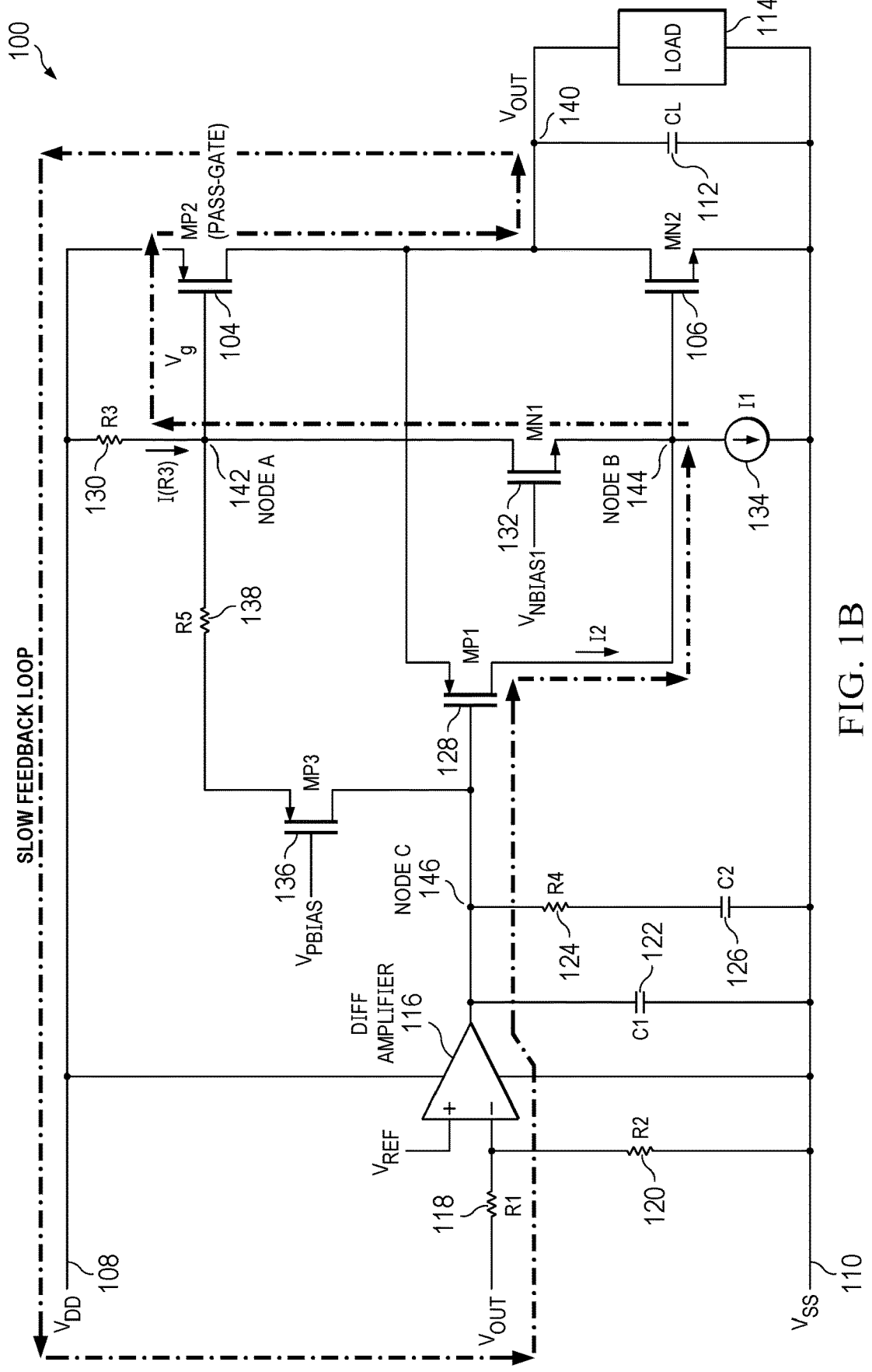
FIG. 1B shows a circuit diagram of the example LDO voltage regulator 100 and first saturation prevention circuit of FIG. 1A, and describes a slow feedback loop.

FIG. 1B shows a circuit diagram of the example LDO voltage regulator 100 and first saturation prevention circuit 101 of FIG. 1A, and describes the slow feedback loop. (Dotted boxes are omitted in FIG. 1B for clarity.) The first, relatively slow feedback loop mentioned above couples $V_{OUT}$ from the output terminal 140 back to, and includes, R1 118 and then the remaining devices of the differential amplifier 116, MP1 128, MN1 132, and the pass-gate 104. The first feedback loop operates as described above, using the output of the differential amplifier 116 to control the gate voltage of MP1 128 to control I2, which in turn controls I(R3) which controls the Vgs of the pass-gate 104 and thereby adjusts the current through the pass-gate 104. The current through the pass-gate 104 determines $V_{OUT}$, and $V_{OUT}$ provides feedback to the differential amplifier 116. Accordingly, as I2 increases, I(R3) decreases, the current flowing through the source-drain path of the pass-gate 104 decreases, and $V_{OUT}$ decreases. Conversely, as I2 decreases, I(R3) increases, the current flowing through the source-drain path of the pass-gate 104 increases, and $V_{OUT}$ increases.

As described, the differential amplifier 116 controls the current through the pass-gate 104 by controlling I2, i.e., by controlling the bias voltage provided to the gate of MP1 128. As the voltage output by the differential amplifier 116 decreases, the current I2 through MP1 128 increases, so that the current through the pass-gate 104 decreases and $V_{OUT}$ decreases. As the voltage output by the differential amplifier 116 increases, the current I2 through MP1 128 decreases, so that the current through the pass-gate 104 increases and $V_{OUT}$ increases. This loop is relatively slow due to, for example, C1 122 and C2 126 (capacitors resist changes in voltage). In some examples, C1 122 and C2 126 act as compensation capacitors. In some examples, an accuracy with which $V_{OUT}$ is regulated is responsive to the first feedback loop. In an example, C1 is 1 picoFarad (pF), C2 is 50 pF, CL is 10 microFarads (10 μF), R1 is 210 kiloOhms (kΩ), R2 is 1000 kΩ, R3 is 100 kΩ, R4 is 400 kΩ, I1 is 50 microAmps (μA), $V_{DD}$ varies between 1.7 and 3.8 volts (V), and the target voltage is 1.5 V. In the example, the first feedback loop may be accurate to within 50-200 μV, with correction performed over the course of 10 to 100 μS.

Figure 1C:
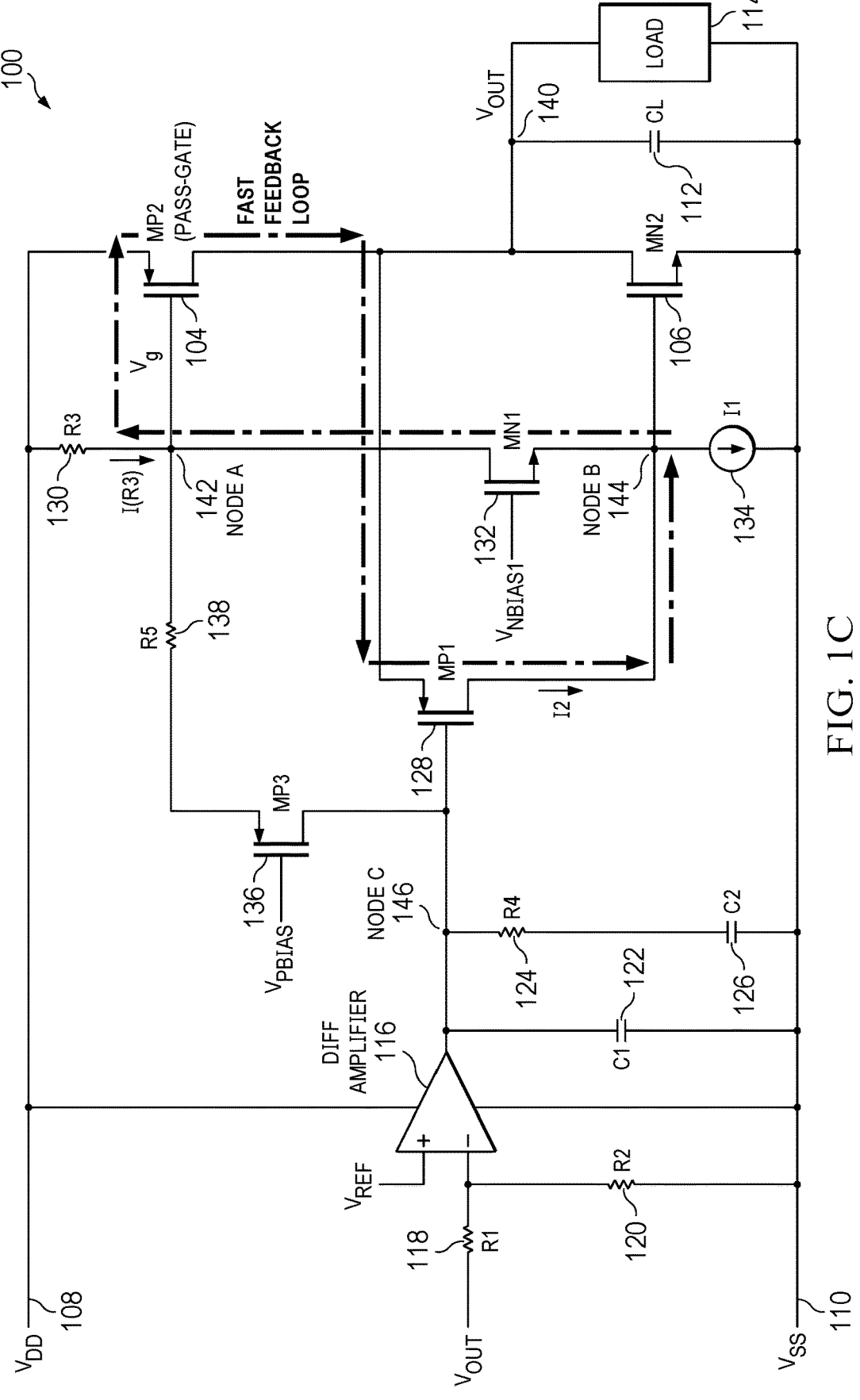
FIG. 1C shows a circuit diagram of the example LDO voltage regulator and first saturation prevention circuit of FIG. 1A, and describes a fast feedback loop.

FIG. 1C shows a circuit diagram of the example LDO voltage regulator 100 and first saturation prevention circuit 101 of FIG. 1A, and describes a fast feedback loop. (Dotted boxes are omitted in FIG. 1B for clarity.) The second, relatively fast feedback loop couples $V_{OUT}$ from the output terminal 140 back to, and includes, the source of MP1 128, then to affect the source/drain path of MN1 132 and the current I(R3) through it, which also affects the voltage across R3 130 and concurrently Vgs of the pass-gate 104. Changes in $V_{OUT}$ cause a change in I2, because MP1 128 is connected as a source follower. The change in I2 changes the current through the source/drain path of MN1 132 and I(R3) through R3 130, changing the Vg coupled to the pass-gate 104. Accordingly, the first and second feedback loops each use negative feedback to correct deviations of $V_{OUT}$ from the target voltage.

In the example above, the second feedback loop may be accurate to within 10 mV, with correction performed over the course of approximately 1 μS. In some examples, the second feedback loop helps the LDO voltage regulator 100 respond rapidly to load transients. However, a relatively large positive or negative deviation from $V_{OUT}$ can result in saturation of the output of the differential amplifier 116, in which case the first and second feedback loops may be unable to quickly recover from the deviation once the load transient abates.

Returning to FIG. 1A, in a saturation condition, in response to a deviation of $V_{OUT}$ from the target voltage that the error amplifier 102 cannot compensate for, the differential amplifier 116 controls MP1 128 to increase or decrease the current I2 outside of normal operational limits. In some examples, this means that in the saturation condition the output of the differential amplifier 116 is equal either to $V_{DD}$ or to $V_{SS}$. Relatively large swings in the differential amplifier 116 output voltage take a relatively long time to recover from. In the example above, a deviation of the target voltage of more than 200 mV due to a load transient can take tens of microseconds (μS) for the first and second feedback loops to correct. In some examples, this constitutes a violation of design constraints. Saturation conditions are further described with respect to, for example, FIGS. 5A, 5B, and 5C.

Operation of the LDO voltage regulator 100 with the first saturation prevention circuit 101 (closed circuit) will now be described. Generally, the first saturation prevention circuit 101 endeavors to restrict node C 146 from saturating toward $V_{SS}$ and node A 142 from saturating toward $V_{DD}$. As described above, as $V_{OUT}$ increases above the target output voltage, the differential amplifier 116 begins to sink current and the voltage at node C 146 decreases towards $V_{SS}$. As the voltage at node C 146 decreases, the Vgs of MP1 128 increases and I2 increases, so that the voltage across R3 130 (and I(R3)) decreases. This causes the voltage at node A 142 to increase. The node A 142 voltage is coupled through R5 138 to the source of MP3 136. $V_{PBIAS}$ equals $V_{DD} - V_{TH} - V_{TRIGGER}$, where $V_{TH}$ is the threshold voltage of MP3 136 and $V_{DD} - V_{TRIGGER}$ is a source voltage of MP3 136 that if reached (or exceeded), activates the first saturation prevention circuit 101, by enabling MP3 136. $V_{TRIGGER}$ is selected based on a selected voltage across R3 130, that is, a selected Vgs of the pass-gate 104.

If the voltage across R3 130 equals or is less than $V_{TRIGGER}$, then the source voltage of MP3 136 (the voltage at node A 142) equals or is greater than $V_{DD}$–$V_{TRIGGER}$, and MP3 136 turns on. After MP3 136 turns on, current flows from node A 142, through R5 138 and MP3 136, into node C 146, towards $V_{SS}$ 110. Once the current sourced via MP3 136 into node C 146 equals the current sunk by the differential amplifier 116, the capacitors at node C 146 (C1 122 and C2 126) stop discharging, and the voltage at node C 146 stops (or is restricted from) decreasing. In some examples, this prevents saturation.

Accordingly, the negative feedback clamping loop provided by the first saturation prevention circuit 101 includes MP3 136, MP1 128, MN1 132, R3 130, and R5 138. Once this clamping loop activates, it regulates the voltage across R3 130 to restrict a decrease in voltage across R3 130 below $V_{TRIGGER}$. The current through MP3 136 increases as the voltage across R3 138 decreases further below $V_{TRIGGER}$, and decreases as the voltage across R3 138 increases towards $V_{TRIGGER}$. This makes changes in voltage across R3 138—and at node A 142—shallower with respect to changes in current sunk by the differential amplifier 116, while the voltage across R3 138 is less than or equal to $V_{TRIGGER}$. This restriction in changing voltage at node A 142 also means that changes in current through the pass-gate 104 are restricted (will be close to zero) while the voltage across R3 138 is less than or equal to $V_{TRIGGER}$.

Put differently, as impedance of the load 114 reduces, current through the pass-gate 104 decreases and $V_{OUT}$ increases. Feedback (via the differential amplifier 116) causes Vg to increase, which reduces the current through the pass-gate 104 to reduce $V_{OUT}$. Once Vg reaches $V_{DD}$–$V_{TRIGGER}$ (so that the voltage across R3 130 equals or is less than $V_{TRIGGER}$), MP3 136 turns on, activating the first saturation prevention circuit 101. At this point, there is low current (e.g., zero or near-zero current) through the pass-gate 104. Activation of the first saturation prevention circuit 101 prevents (or restricts) Vg from increasing, which prevents the Vgs of the pass-gate 104 from falling further. As the LDO voltage regulator 100 returns to normal operation, so that there is a normal impedance in the load, Vg decreases, turning off MP3 136 and deactivating the first saturation prevention circuit 101. Also, the current through the pass-gate 104 increases to a nominal value, returning $V_{OUT}$ to the target voltage. Accordingly, during normal operation, the first saturation prevention circuit 101 does not affect the stability of the feedback loops maintaining $V_{OUT}$ at the target voltage.

In the example above, R5 138 equals 1 megaOhm (MΩ; embodied using, for example, a biased transistor) and $V_{TRIGGER}$ equals 200 mV. MP3 136 turns on after $V_{OUT}$ increases above the target output voltage by a few microvolts (μV). In some examples related to the example above, $V_{OUT}$ overshoots by a few tens of millivolts, so that the voltage at node C 146 decreases quickly and the Vgs of MP1 128 increases quickly, which quickly changes I2 and the voltage at node A 142. This results in rapid activation of MP3 136.

In some examples, R5 138 limits the maximum current through MP3 136. In such examples, when $V_{OUT}$ increases above the target voltage more than a maximum level for which the first saturation prevention circuit 101 can compensate, the first feedback loop pulls the output voltage of the differential amplifier 116 towards $V_{SS}$ harder than the current through MP3 136 pulls that output voltage up. In other words, beyond the maximum deviation for which the first saturation prevention circuit 101 can compensate, the differential amplifier 116 sinks more current than the first saturation prevention circuit 101 is able to source. In the above-described example, the differential amplifier 116 can sink up to 250 nanoAmperes (nA), while the current that the first saturation prevention circuit 101 can supply is limited to 200 nA.

Figure 2:
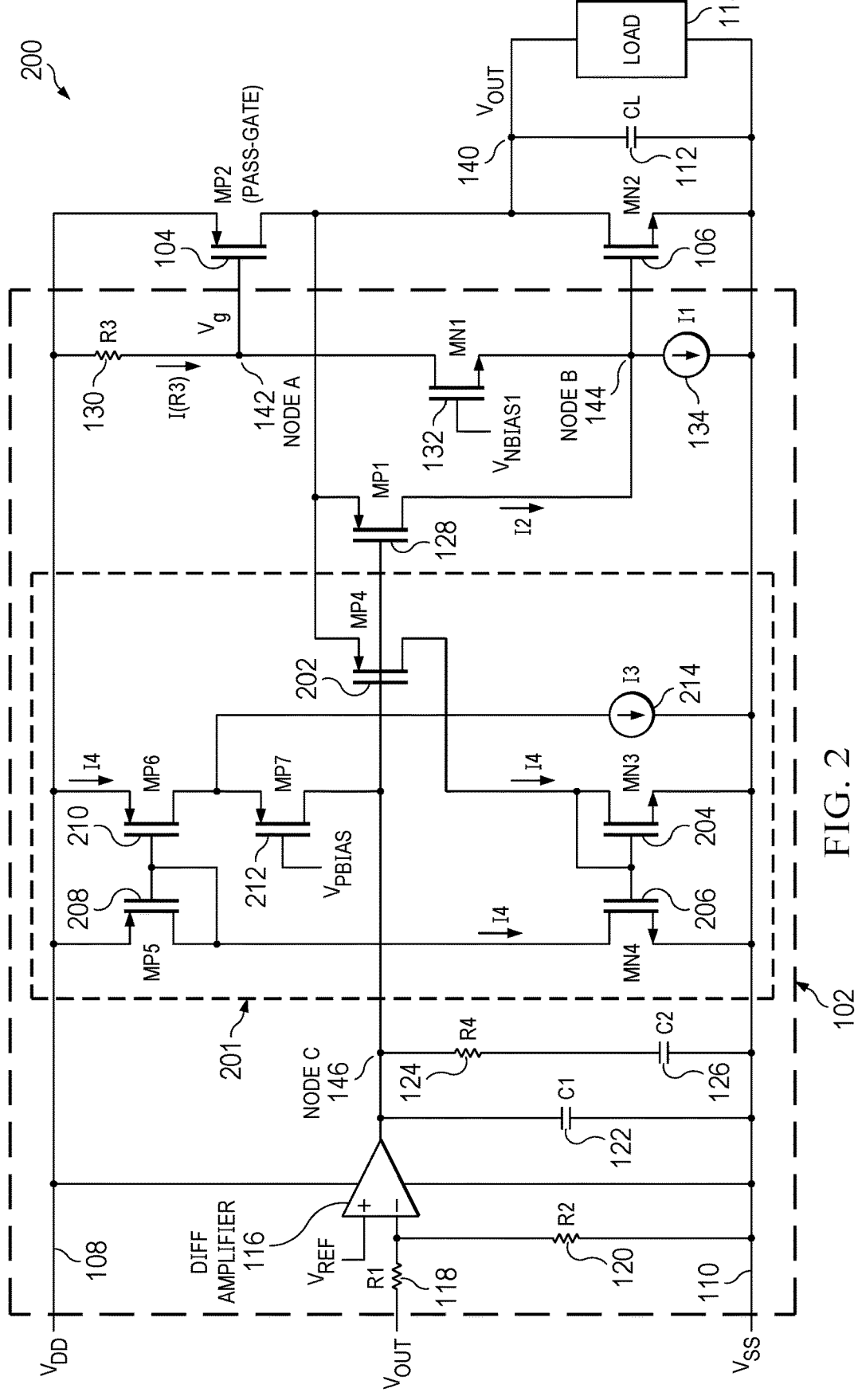
FIG. 2 shows a circuit diagram of an example LDO voltage regulator with a second saturation prevention circuit.

FIG. 2 shows a circuit diagram of an example LDO voltage regulator 200 that may include some or all of the LDO voltage regulator 100. The LDO voltage regulator 200 includes the second saturation prevention circuit 201. The second saturation prevention circuit 201 includes a fourth p-channel MOSFET (MP4) 202, a third n-channel MOSFET (MN3) 204, a fourth n-channel MOSFET (MN4) 206, a fifth p-channel MOSFET (MP5) 208, a sixth p-channel MOSFET (MP6) 210, a seventh p-channel MOSFET (MP7) 212, and a second current source (I3) 214.

A source of MP4 202 is connected to the source of MP1 128, the drain of MP2 104, the drain of MN2 106, the first plate of CL 112, and the first terminal of the load 114. A gate of MP4 202 is connected to the gate of MP1 128, a drain of MP7 212, the output of the differential amplifier 116, the first plate of C1 122, and the first terminal of R4 124 (all connected to node C 146). A drain of MP4 202 is connected to a drain and a gate of MN3 204, and a gate of MN4 206. Sources of MN3 204 and MN4 206 are connected to $V_{SS}$ 110. Accordingly, a current (I4) through the source-drain path of MP4 202 mirrors the current (I2) through the source-drain path of MP1 128. That is, MP4 202 has the same Vgs as MP1 128, and MP4 202 and MP1 128 are matched so that I4 is proportional to I2. Referring to the example described above, I4 may be configured to be one twentieth of I2. In this example, during normal operation, the source-drain current of MP4 202 may be 2 μA and I3 may be 6 μA.

A drain of MN4 206 is connected to a gate and a drain of MP5 208 and a gate of MP6 210. Sources of MP5 208 and MP6 210 are connected to $V_{DD}$ 108. A drain of MP6 210 is connected to a source of MP7 212 and to a first terminal of the second current source I3 214, which provides a third current I3. A gate of MP7 212 receives the voltage $V_{PBIAS}$. A second terminal of the second current source I3 214 is connected to $V_{SS}$ 110. MN3 204 and MN4 206 together form a current mirror, so that the current through the source-drain path of MN4 206 is I4. MP5 208 and MP6 210 also act to form a current mirror, so that the source-drain path of MP6 210 provides the current I4 flowing to the source of MP7 212. I3 flows away from the source of MP7 212.

If I4 is greater than I3, then the source voltage of MP7 212 increases until MP7 212 turns on, providing current to node C 146 to balance the current sunk by the output of the differential amplifier 116. I3 is selected so that I4 exceeds I3 at a selected Vgs of MP4 212 (which equals the Vgs of MP1 212), that is, a selected difference between the voltage at node C 146 and $V_{OUT}$. Accordingly, because the Vgs of MP7 212 is dependent on the relative levels of I4 and I3, the value of $V_{TRIGGER}$ is less important for the second saturation prevention circuit 101. In some examples, MP3 136 and MP7 212 use different gate voltages.

After MP7 212 turns on, activating the second saturation prevention circuit 201 and clamping the voltage at node C 146 (the gate voltage of MP4 202), increases in $V_{OUT}$ (the source voltage of MP4 202) cause MP4 202 to become more conductive, so that I4 increases and the current provided by MP7 212 to node C 146 increases. This enables the current sourced by MP7 212 to node C 146 to scale up to the maximum amount of current that the output of the differential amplifier 116 can sink. This means that once the second saturation prevention circuit 201 is activated by MP7 212 turning on, the current sourced by MP7 212 prevents (or restricts) the differential amplifier 116 from reducing the voltage at node C 146.

In the example described above (in the LDO voltage regulator 200, which includes the second saturation prevention circuit 201 but does not include the first saturation prevention circuit 101), the second saturation prevention circuit 202 can be configured to activate when $V_{OUT}$ is a few $\mu V$ above the target voltage. Also, MP7 212 turns on if I4 is greater than I3 (6 $\mu A$); as described above, I4 is one twentieth of I2. When MP7 212 turns on, the Vgs of MP1 128 is increased so that MP1 can carry 120 $\mu A$ (20×6). Because MP1 128 is sourcing 120 $\mu A$ to node B 144, the voltage at node B 144 increases and the Vds of MP1 128 decreases until the current through MP1 128 decreases to 50 $\mu A$. Accordingly, when the second saturation prevention circuit 201 activates, the voltage at node B 144 approaches $V_{OUT}$.

Figure 3:
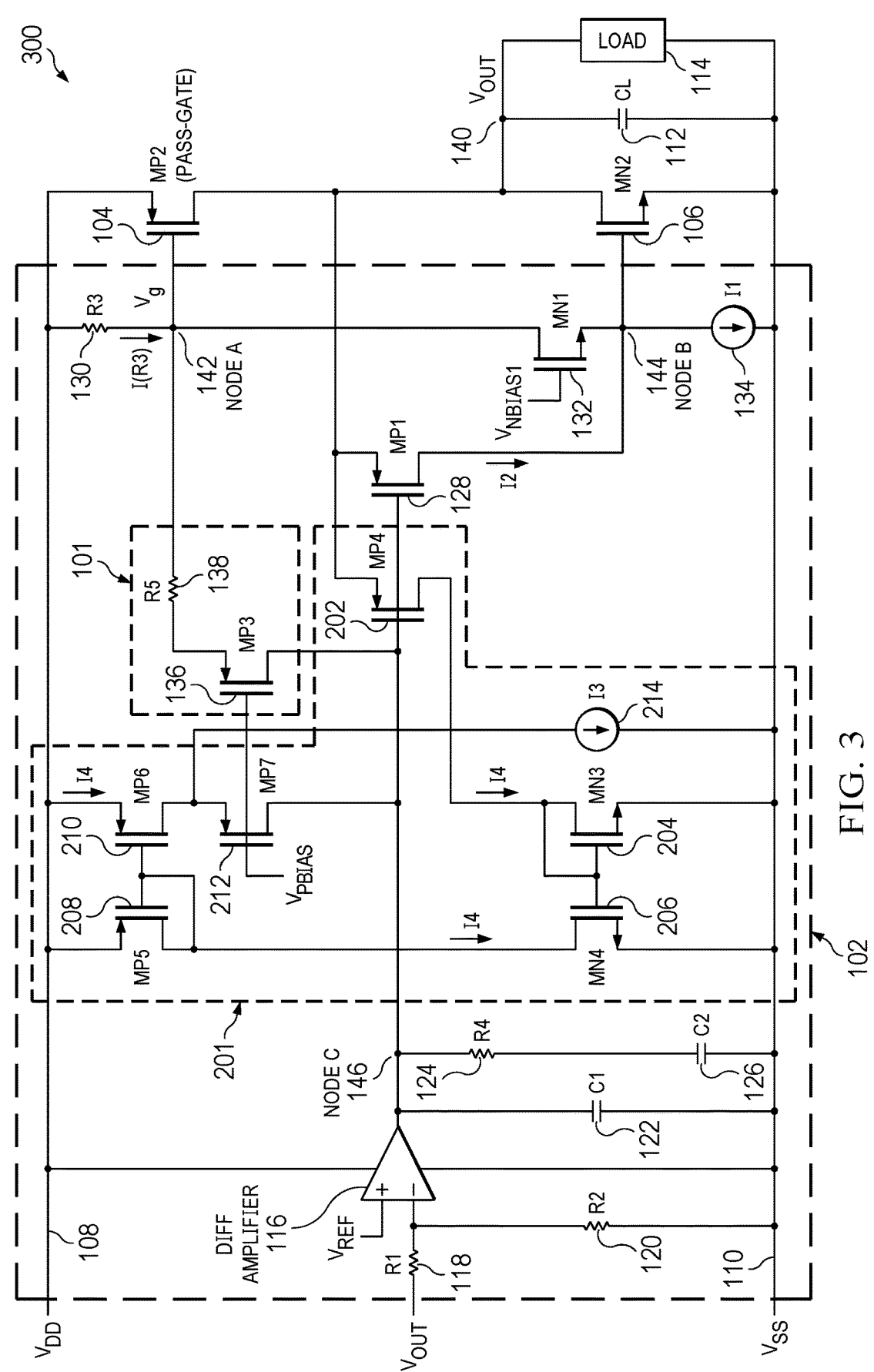
FIG. 3 shows a circuit diagram of an example LDO voltage regulator with the first saturation prevention circuit of FIG. 1 and the second saturation prevention circuit of FIG. 2.

FIG. 3 shows a circuit diagram of an example LDO voltage regulator 300 that may include some or all of the elements of LDO voltage regulator 100 and/or LDO voltage regulator 200. For example, the LDO voltage regulator 300 of FIG. 3 may include the first saturation prevention circuit 101 of FIG. 1 and the second saturation prevention circuit 201 of FIG. 2. In the LDO voltage regulator 300, the first saturation prevention circuit 101 and the second saturation prevention circuit 201 work together. The first saturation prevention circuit 101 provides current from node A 142 to the output of the differential amplifier 116 up to a first level. The second prevention circuit 201 provides current to the output of the differential amplifier 116 from a second level to a third level.

In some examples, the first level is a level at which the first saturation prevention circuit 101 is no longer effective to source sufficient current to keep up with the amount of current that the differential amplifier 116 sinks, i.e., above a corresponding level of $V_{OUT}$ that is greater than the target voltage. In some examples, there is some overlap (hysteresis) between MP7 212 turning on and current through MP3 136 remaining effective to clamp the voltage at node C 146, so that the second saturation prevention circuit 201 already provides current to clamp the voltage at node C 146 when the first saturation prevention circuit 101 is no longer able to keep up with current sunk by the output of the differential amplifier 116. That is, where this hysteresis is implemented, the second level is less than the first level. In some examples, the third level is greater than or equal to a maximum current that the differential amplifier 116 is able to sink.

Referring to the example described above (with respect to the LDO voltage regulator 300, which includes both the first saturation prevention circuit 101 and the second saturation prevention circuit 201), if $V_{OUT}$ is 100 $\mu V$ above the target voltage (1.5001 V), the differential amplifier sinks 100 nA, causing node C 146 to discharge. After some delay, a decrease in voltage at node C 146 of between 10 and 30 mV causes the Vgs of MP4 202 to increase sufficiently that I4 is greater than I3, and MP7 212 turns on, activating the clamping function of the second saturation prevention circuit 201. This means that the differential amplifier 116 saturates toward $V_{SS}$ by 10 to 30 mV before being clamped by the current through MP7 212.

The differential amplifier 116 can sink up to 250 nA, the first saturation prevention circuit 101 can source up to 200 nA, and the second saturation prevention circuit 201 can source up to a few microamps. The first saturation prevention circuit 101 is an accurate, rapidly activating clamp, but (in some examples) unable to source sufficient current to balance the maximum current that the differential amplifier 116 can sink. However, the second saturation prevention circuit 201 is able to source sufficient current to balance the maximum current sunk by the differential amplifier 116, preventing further saturation once the second saturation prevention circuit 201 is activated.

Figure 4:
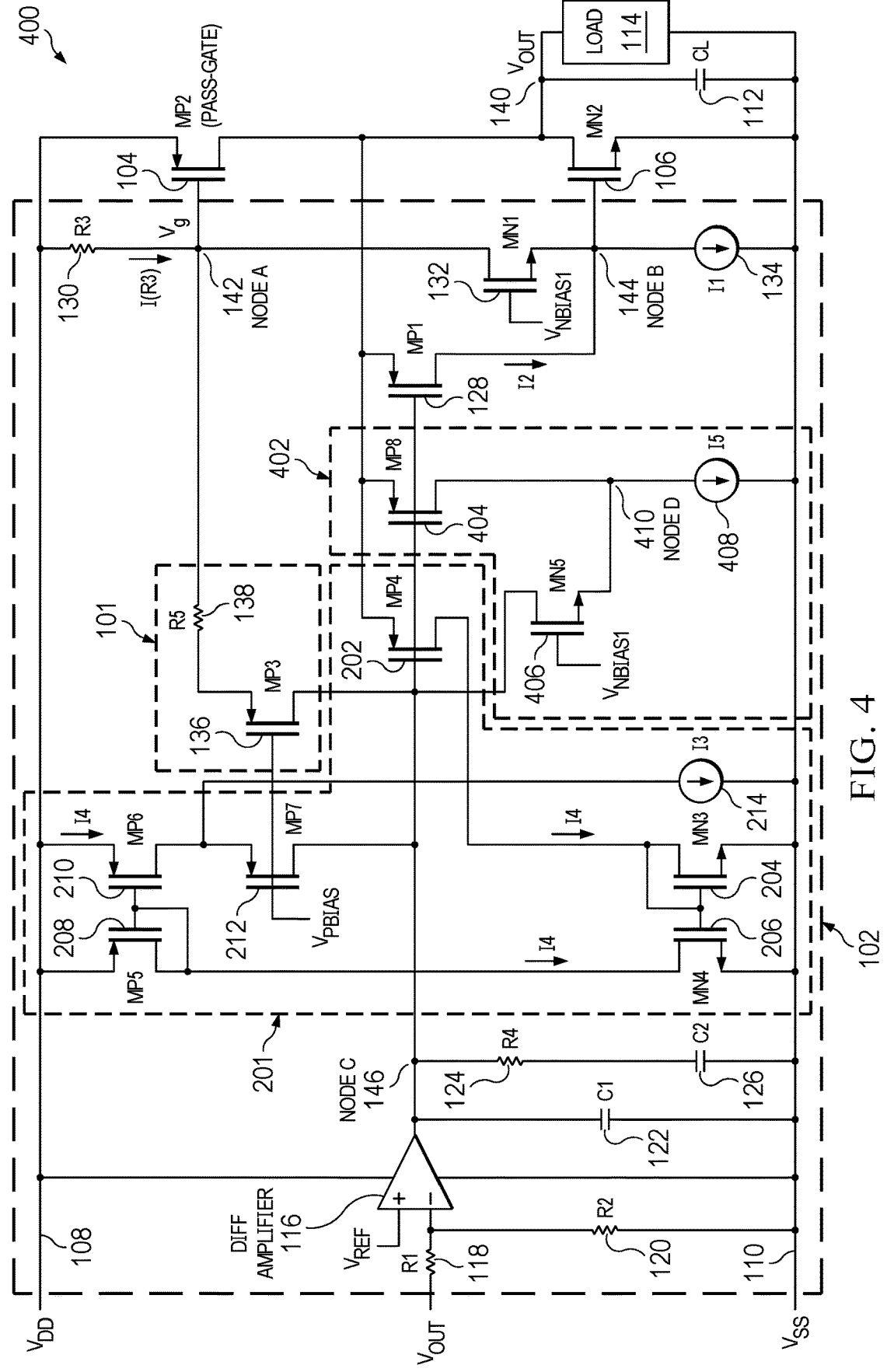
FIG. 4 shows a circuit diagram of an example LDO voltage regulator with the first and second saturation prevention circuits and as shown in FIG. 3, as well as a third saturation prevention circuit.

FIG. 4 shows a circuit diagram of an example LDO voltage regulator 400 that may include some or all of the elements of LDO voltage regulator 100, LDO regulator 200, and/or LDO voltage regulator 300. For example, the LDO voltage regulator 400 may include the first and second saturation prevention circuits 101 and 201 as shown in FIG. 3, as well as the third saturation prevention circuit 402. The third saturation prevention circuit 402 includes an eighth p-channel MOSFET (MP8) 404, a fifth n-channel MOSFET (MN5) 406, and a third current source (I5) 408, which provides a current I5. A source of MP8 404 is connected to the sources of MP1 128 and MP4 202, the drains of MP2 104 and MN2 106, the first plate of CL 112, and the first terminal of the load 114. The gate of MP8 404 is connected to the gates of MP1 128 and MP4 202, a source of MN5 406, the drains of MP3 136 and MP7 212, the first terminal of R4 124, the first plate of C1 122, and the output of the differential amplifier 116. The drain of MP8 404 is connected to a source of MN5 406 and a first terminal of the third current source I5 408. A second terminal of the third current source I5 408 is connected to $V_{SS}$ 110. The gate of MN5 406 receives a bias voltage $V_{NBIAS2}$. A node D 410 is located between the drain of MP8 404, the source of MN5 406, and the first terminal of the third current source I5 408. In normal operation, the voltage at node D 410 is near to, but less than, $V_{OUT}$.

$V_{NBIAS2}$ equals $V_{TH}+V_{TRIGGER}$, where $V_{TH}$ is the threshold voltage for MN5 406 and $V_{TRIGGER}$ is a trigger voltage for activation of MN5 406 ($V_{TH}$ and $V_{TRIGGER}$ for MN5 406 may be different from $V_{TH}$ and $V_{TRIGGER}$ for MP3 136 and MP7 212). This means that when the voltage at node D 410 falls below $V_{TRIGGER}$, MN5 406 turns on and the third saturation prevention circuit 402 sinks up to I5 from the output of the differential amplifier 116. The voltage at node D 410 decreases if the source-drain current of MP8 404 is less than I5. As described above with respect to $V_{PBIAS}$, $V_{TRIGGER}$ is selected based on the Vgs of MP1 128.

A current through the source-drain path of MP8 404 mirrors the current (I2) through the source-drain path of MP1 128. That is, MP8 404 has the same Vgs as MP1 128, and MP1 128 and MP8 404 are matched so that the current through the source-drain path of MP8 404 is proportional to I2. This means that the source-drain current of MP8 404 being less than I5 corresponds to I2 being less than a threshold current level and the Vgs of MP1 128 (and MP8 404) being less than a threshold voltage. MN5 406 turns on to sink current from node C 146, clamping the voltage at node C 146 (preventing or restricting the voltage at node C 146 from increasing) by preventing C1 122 and C2 126 from charging further. This also prevents I2 from falling below the threshold current level.

Put differently, if $V_{OUT}$ decreases below the target voltage (for example, by a few $\mu V$), the voltage at node C 146 is increased by the current sourced by the differential amplifier 116. Increasing node C voltage 146 reduces the Vgs of MP8 404, which reduces the source-drain current of MP8 404. After a delay (as voltage and current levels change in response to the current sourced by the differential amplifier), the Vgs of MP8 404 falls sufficiently that the source-drain current of MP8 404 is less than I5, which causes the voltage at node D 410 to decrease towards $V_{SS}$. MN5 406 turns on once the voltage at node D 410 falls below $V_{TRIGGER}$. MN5 406 then sinks sufficient current from node C 146 to clamp the Vgs of MP8 404 (which equals the voltage at node C 146 minus $V_{OUT}$). Accordingly, the Vgs of MP8 404 acts as a trigger voltage to activate the third clamp 402. In some examples, $V_{TRIGGER}$ (the trigger voltage for activation of MN5 406) is selected so that the comparison between the source-drain current of MP8 404 and I5 can be made reliably.

Referring to the example described above, the current through the source-drain path of MP8 404 may be configured to be one tenth of I2. In some examples, I5 is greater than or equal to the maximum current that can be sourced by the output of the differential amplifier 116. Referring to the above-described example, the differential amplifier 116 sources up to 300 nA, I5 equals 1 μA, and during normal operation the source-drain current of MP8 404 is 5 μA. MN3 408 turns on when $V_{OUT}$ falls 50 μV below the target voltage, i.e., to 1.45 mV.

Figure 5A:
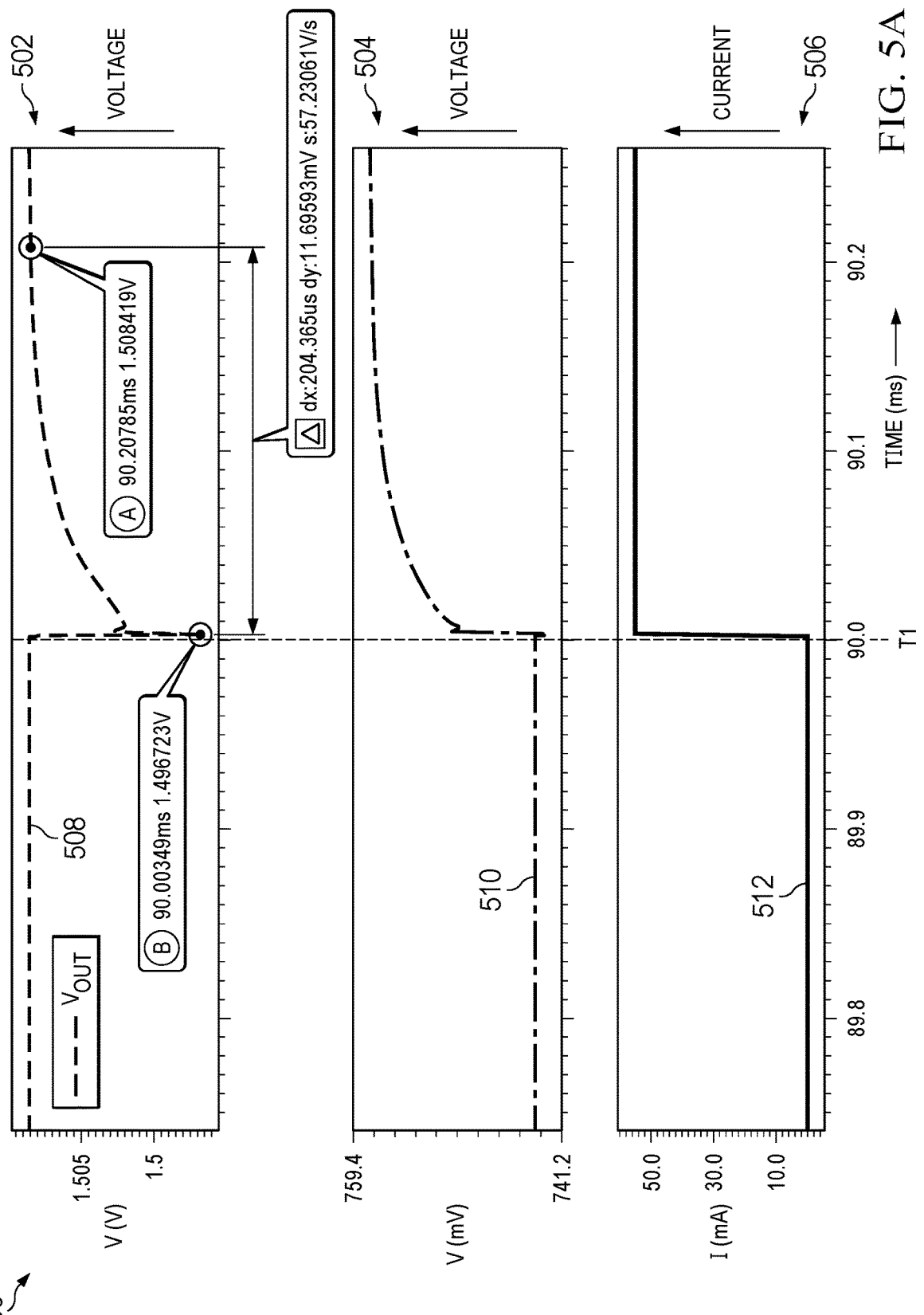
FIG. 5A shows a first set of graphs illustrating behavior of an LDO voltage regulator as shown in FIG. 1 (without the first saturation prevention circuit), operating in a non-saturation condition.

FIG. 5A shows a first set of graphs 500 illustrating behavior of an LDO voltage regulator 100 as shown in FIG. 1 (without the first saturation prevention circuit 101), operating in a non-saturation condition. The horizontal axis represents time in each of a first graph 502, a second graph 504, and a third graph 506. The vertical axes in the first and second graphs 502 and 504 represent voltage, and in the third graph 506 represents current. The first graph 502 includes a $V_{OUT}$ curve 508, the second graph 504 includes a differential amplifier output voltage curve 510, and the third graph 506 includes a load current curve 512.

At time T1, the load current curve 512 indicates a sudden increase in the amount of current drawn by the load 114, i.e., a load transient. This causes $V_{OUT}$ 508 to drop. In response, the differential amplifier output voltage 116 increases to increase the current through the pass-gate 104, attempting to return $V_{OUT}$ 508 to the target voltage.

Figure 5B:
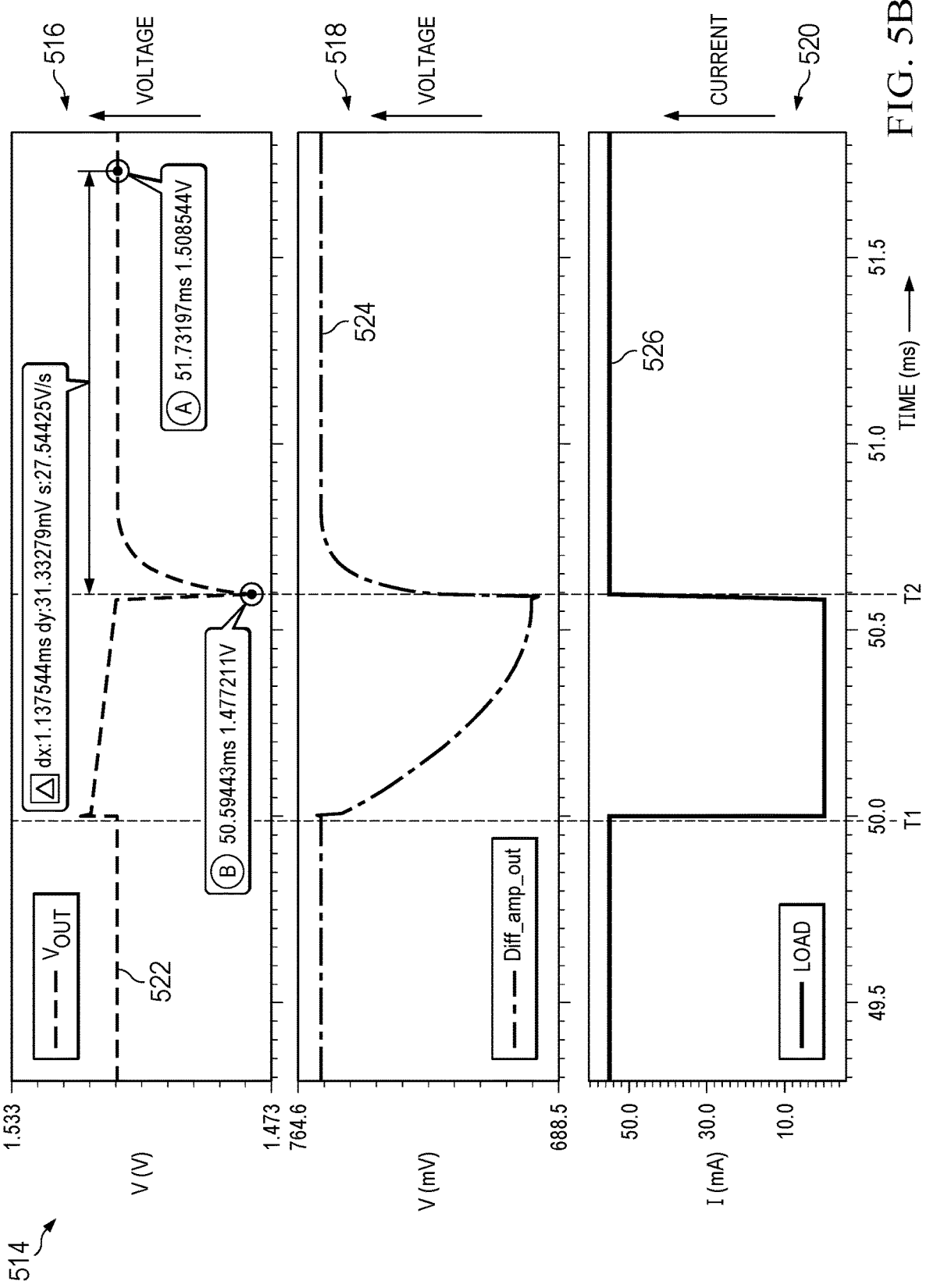
FIG. 5B shows a second set of graphs illustrating behavior of an LDO voltage regulator as shown in FIG. 1 (without the first saturation prevention circuit).

FIG. 5B shows a second set of graphs 514 illustrating behavior of an LDO voltage regulator 100 as shown in FIG. 1 (without the first saturation prevention circuit 101). The horizontal axis represents time in each of a fourth graph 516, a fifth graph 518, and a sixth graph 520. The vertical axes in the fourth and fifth graphs 516 and 518 represent voltage, and in the sixth graph 506 represents current. The fourth graph 516 includes a $V_{OUT}$ curve 522, the fifth graph 518 includes a differential amplifier output voltage curve 524, and the sixth graph 520 includes a load current curve 526.

At time T1, the load current curve 526 indicates a sudden decrease in the amount of current drawn by the load 114, i.e., a load transient, such as a load transient corresponding to a sudden disconnection of the load 114. This causes $V_{OUT}$ 522 to rise. In response, the differential amplifier output voltage 524 decreases to decrease the current through the pass-gate 104, attempting to return $V_{OUT}$ 522 to the regulation voltage. However, in this attempt, the differential amplifier 116 lowers its output voltage 524 to a minimum—that is, the differential amplifier 116 enters saturation. At time T2, the load current 526 returns to nominal, indicating an end to the load transient, such as by reconnection of the load 114. $V_{OUT}$ 522 drops more in response to the sudden increase in load current 512 than $V_{OUT}$ 508 (in the first graph 502) fell after the load current 512 suddenly increased. This is because, at time T2 in the second set of graphs 514, the differential amplifier 116 is in saturation. Accordingly, saturation can cause increased deviations of $V_{OUT}$ 522 from the target voltage.

Figure 5C:
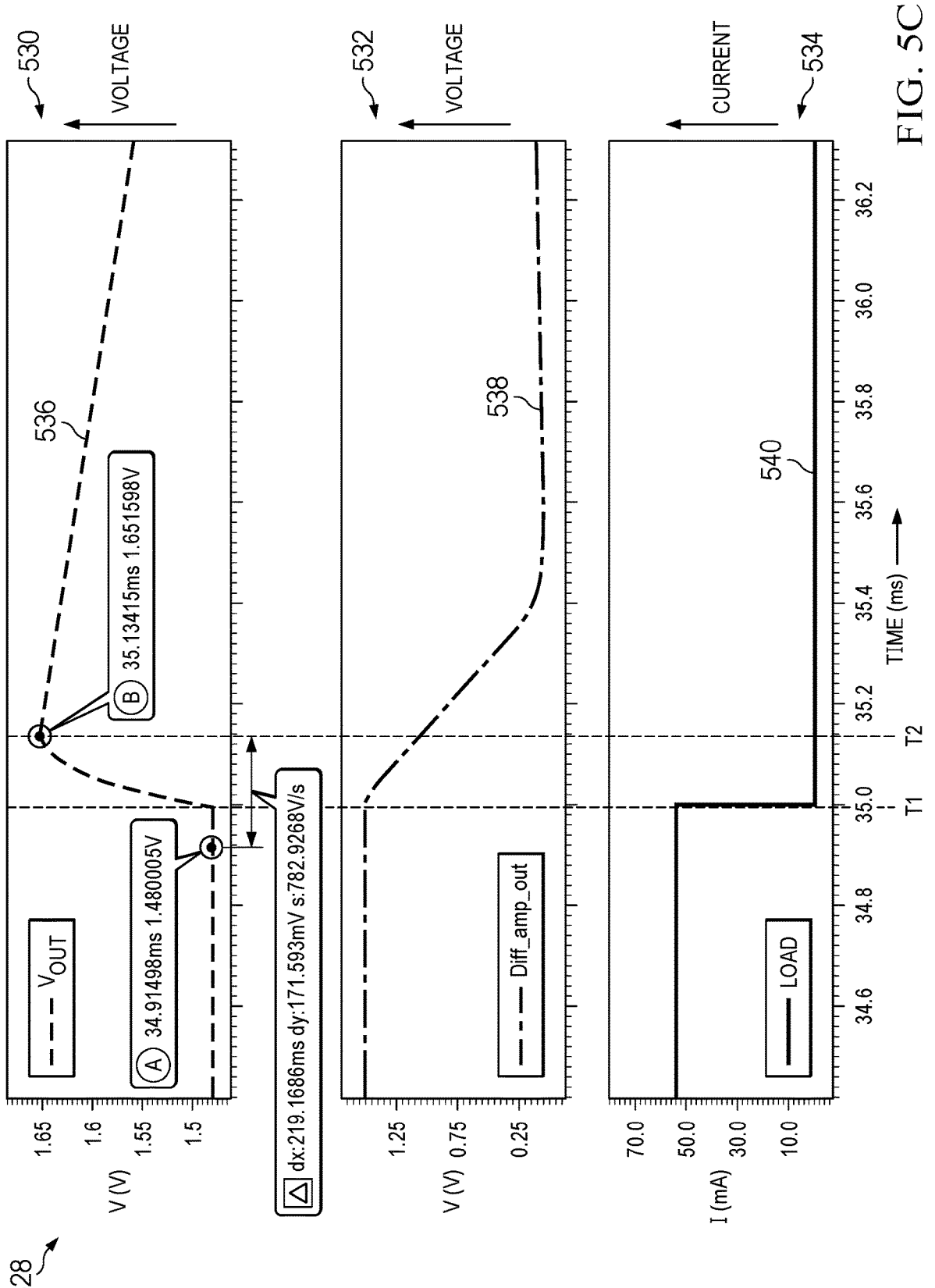
FIG. 5C shows a third set of graphs illustrating behavior of an LDO voltage regulator as shown in FIG. 4 (without the first, second, and third saturation prevention circuits), operating in a maximum load condition.

FIG. 5C shows a third set of graphs 528 illustrating behavior of an LDO voltage regulator 100 as shown in FIG. 4 (without the first, second, and third saturation prevention circuits 101, 201, and 402), operating in a maximum load condition and minimum supply. The horizontal axis represents time in each of a seventh graph 530, an eighth graph 532, and a ninth graph 534. The vertical axes in the seventh and eighth graphs 530 and 532 represent voltage, and in the ninth graph 534 represents current. The seventh graph 530 includes a $V_{OUT}$ curve 536, the eighth graph 532 includes a differential amplifier output voltage curve 538, and the ninth graph 534 includes a load current curve 540.

Prior to time T1, the supply voltage ($V_{DD}$, not shown) is relatively low, e.g., 1.7 V, so that $V_{OUT}$ 536 is below the target voltage. This causes the differential amplifier 116 to produce an output voltage 538 corresponding to a maximum differential amplifier output voltage 538—i.e., the differential amplifier 116 is operating in saturation. This corresponds to abnormal operation that would be addressed by the third saturation prevention circuit 402, which is not present. At time T1, the load current curve 540 indicates a sudden decrease in the amount of current drawn by the load 114 (e.g., a load dropout), so that the LDO voltage regulator 100 is no longer operating in a maximum load condition. This causes $V_{OUT}$ 538 to rise. The differential amplifier output voltage 538 falls, but the differential amplifier 116 is unable to change its output voltage 538 fast enough to prevent $V_{OUT}$ 538 from overshooting. This corresponds to abnormal operation that would be addressed by the first and second saturation prevention circuits 101 and 201, which are not present. $V_{OUT}$ 538 reaches a maximum level at time T2, after which $V_{OUT}$ 538 decreases as a result of discharging capacitances.

Figure 6A:
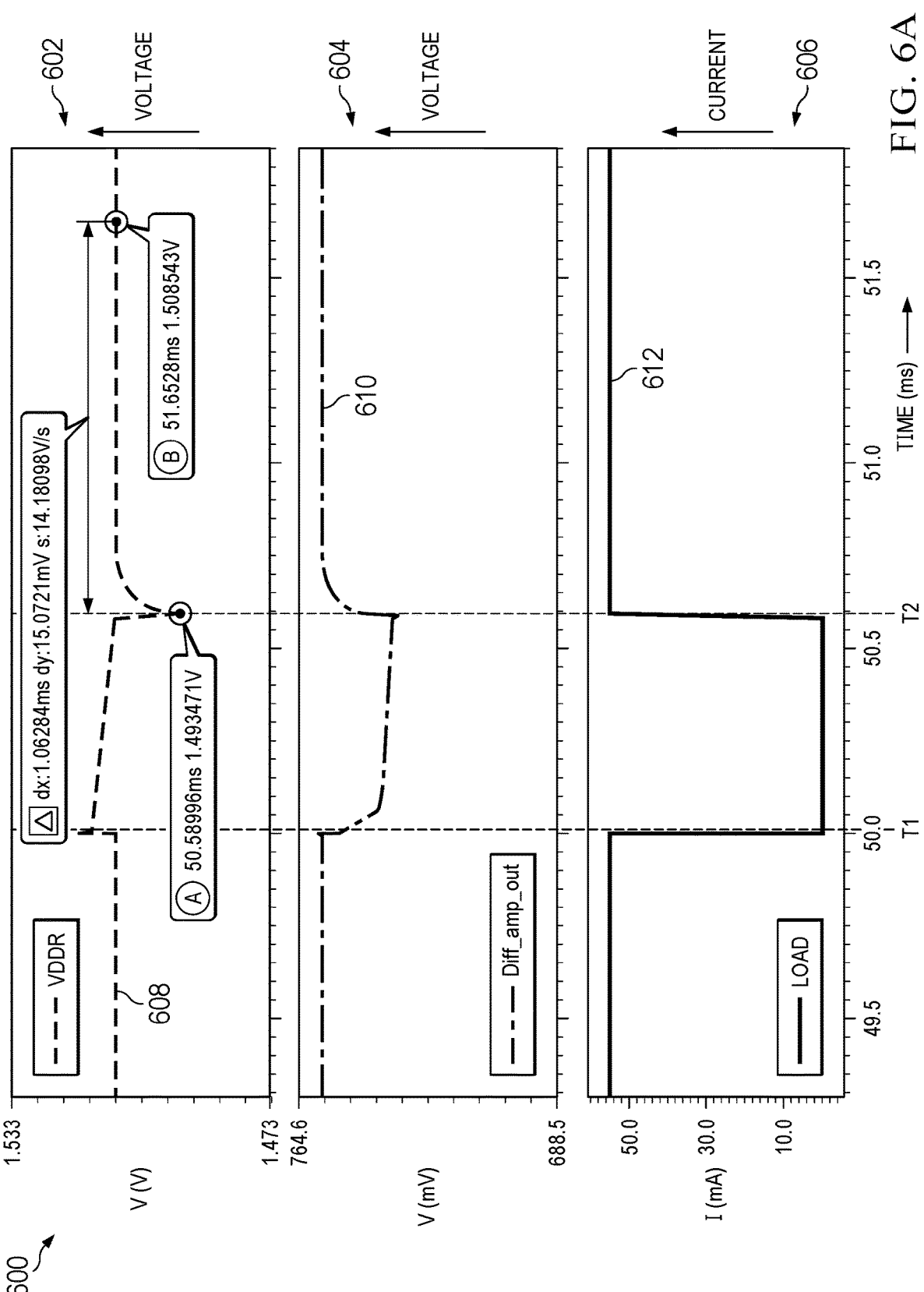
FIG. 6A shows a first set of graphs illustrating behavior of an LDO voltage regulator as shown in FIG. 3.

FIG. 6A shows a first set of graphs 600 illustrating behavior of an LDO voltage regulator 300 as shown in FIG. 3. The horizontal axis represents time in each of a first graph 602, a second graph 604, and a third graph 606. The vertical axes in the first and second graphs 602 and 604 represent voltage, and in the third graph 606 represents current. The first graph 602 includes a $V_{OUT}$ curve 608, the second graph 604 includes a differential amplifier output voltage curve 610, and the third graph 606 includes a load current curve 612.

At time T1, the load current curve 612 indicates a sudden decrease in the amount of current drawn by the load 114, i.e., a load transient, such as a load transient corresponding to a sudden disconnection of the load 114. This causes $V_{OUT}$ 608 to rise. In response, the differential amplifier output voltage 610 decreases to decrease the current through the pass-gate 104, attempting to return $V_{OUT}$ 608 to the target voltage. Unlike in FIG. 5B, the first and second saturation prevention circuits 101 and 201 source additional current to the output of the differential amplifier 116, preventing the differential amplifier output voltage 610 from reaching saturation levels. During the load transient, $V_{OUT}$ 608 behaves similarly to the behavior of $V_{OUT}$ 522 (see FIG. 5B). However, after T2, when the load transient ends, because the differential amplifier 116 is not in saturation, $V_{OUT}$ 608 experiences a relatively small dip before being returned to the target voltage.

Figure 6B:
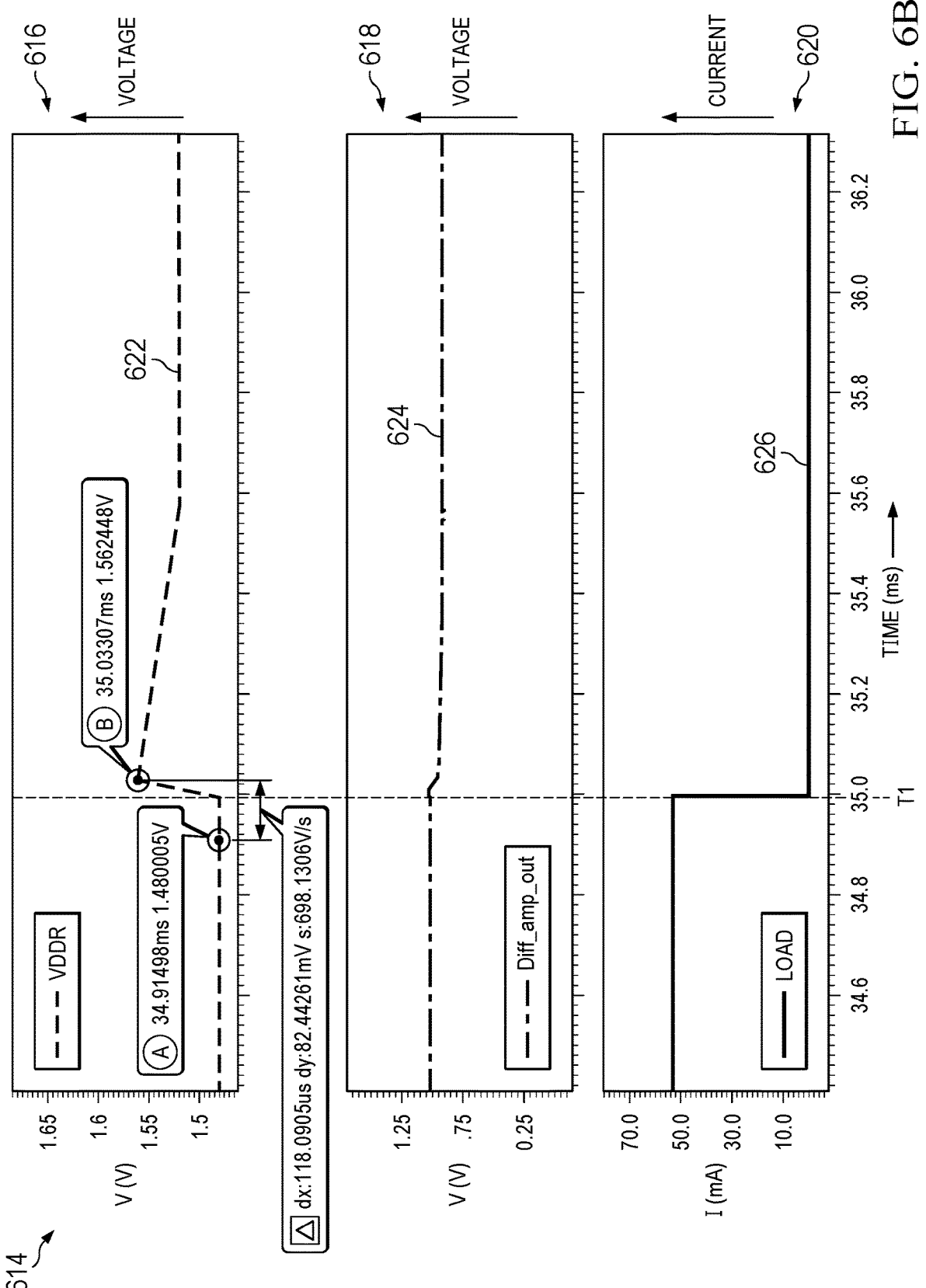
FIG. 6B shows a second set of graphs illustrating behavior of an LDO voltage regulator as shown in FIG. 3, operating in a maximum load condition.

FIG. 6B shows a second set of graphs 614 illustrating behavior of an LDO voltage regulator 300 as shown in FIG. 4, operating in a maximum load condition. The horizontal axis represents time in each of a fourth graph6, a fifth graph 618, and a sixth graph 620. The vertical axes in the fourth and fifth graphs 616 and 618 represent voltage, and in the sixth graph 606 represents current. The fourth graph 616 includes a $V_{OUT}$ curve 622, the fifth graph 618 includes a differential amplifier output voltage curve 624, and the sixth graph 620 includes a load current curve 626.

Prior to time T1, the supply voltage ($V_{DD}$) is relatively low, e.g., 1.7 V. $V_{OUT}$ 622 falls below the target voltage. However, unlike in FIG. 5C, the third saturation prevention circuit 402 prevents the differential amplifier 116 from entering saturation. At time T1, the load current curve 626 indicates a sudden decrease in the amount of current drawn by the load 114, so that the LDO voltage regulator 100 is no longer operating in a maximum load condition. This causes $V_{OUT}$ 622 to rise. However, because the differential amplifier 116 is not operating in saturation, the rise in $V_{OUT}$ 622 is relatively small, and the differential amplifier 116 is able to respond relatively quickly to return $V_{OUT}$ 622 to the target voltage. When $V_{OUT}$ is above the target voltage after load release, the first and second saturation prevention circuits 101 and 201 prevent the output voltage of the differential amplifier 116 from saturating towards $V_{SS}$.

Modifications are possible in the described embodiments, and other embodiments are possible, within the scope of the claims.

In some examples, the structures of FIGS. 1A through 4 can refer to or be implemented as or in an amplifier other than an LDO voltage regulator.

In some examples, one or more of the first, second, or third saturation prevention circuits 101, 201, or 402 includes different resistors, capacitors, transistors, or other components than those described above, to accomplish similar saturation prevention function as described above.

In some examples, one or more of the first, second, or third saturation prevention circuits 101, 201, or 402 is arranged differently than described above to accomplish similar saturation prevention function as described above.

In some examples, resistive elements other than resistors are used.

In some examples, capacitive elements other than capacitors are used.

In some examples, transistors other than MOSFETs are used.

In some examples, voltage or current control elements other than transistors are used.

In some examples, one or more of the first, second, or third saturation prevention circuits 101, 201, or 402 is used with a type of voltage regulator other than an LDO voltage regulator.

In some examples, one or more of the first, second, or third saturation prevention circuits 101, 201, or 402 is used with, and to prevent saturation of, an amplifier.

In some examples, a reference voltage is produced by a source other than a bandgap voltage reference.

In some examples, MP3 136 and MP7 212 have different gate voltages.

In some examples, MP7 212 is not included in a second saturation prevention circuit, and the drain of MP6 210 is connected to the source of MP3 136 and the first terminal of I3 214.

In some examples, there is always some current through the source-drain paths of MP1 128, MP4 202, and MP8 404.

In some examples, the drain of MP6 210 is coupled to the source of MP3 136, and the first terminal of the second current source 214 is connected to the source of MN3 214 instead of the drain of MP6. In some such examples, this can result in a leakage current. In some such examples, MP7 212 is not included.

In some examples, the source of MN5 406 is coupled to node A 142 or node B 144. In some such examples, MP8 404 and the third current source 408 are not included.

What is claimed is:

1. An amplifier comprising:
a first transistor including a current terminal and a control terminal;
a resistive element including a terminal coupled to the control terminal of the first transistor;
a second transistor including a current terminal and a control terminal;
a differential amplifier including an output; and
a saturation prevention circuit including an input and an output, the input of the saturation prevention circuit coupled to the terminal of the resistive element and to the control terminal of the first transistor, the output of the saturation prevention circuit coupled to the output of the differential amplifier and to the control terminal of the second transistor.

2. The amplifier of claim 1,
wherein the resistive element is a first resistive element;
wherein the saturation prevention circuit includes a second resistive element including a first terminal and a second terminal, and a third transistor including a first current terminal, a second current terminal, and a control terminal;
wherein the first terminal of the second resistive element is coupled to the input of the saturation prevention circuit, and the second terminal of the second resistive element is coupled to the first current terminal of the third transistor; and
wherein the second current terminal of the third transistor is coupled to the output of the saturation prevention circuit.

3. The amplifier of claim 1, wherein the saturation prevention circuit is configurable to provide a current to clamp a voltage at the output of the differential amplifier based on a gate-source voltage of the first transistor being less than a threshold voltage.

4. The amplifier of claim 1, wherein the saturation prevention circuit is a first saturation prevention circuit;
further including a second saturation prevention circuit and a ground node, the second saturation prevention circuit including:
a current source including a first terminal and a second terminal, the first terminal of the current source coupled to the ground node;
a third transistor including a first current terminal, a second current terminal, and a control terminal, the first current terminal of the third transistor coupled to the current terminal of the first transistor and the current terminal of the second transistor;
a fourth transistor including a first current terminal, a second current terminal, and a control terminal, the second current terminal of the fourth transistor coupled to the output of the differential amplifier;
a first current mirror coupled to the ground node and the second current terminal of the third transistor; and
a second current mirror coupled to the first current mirror, the first current terminal of the fourth transistor, and the second terminal of the current source.

5. The amplifier of claim 4, wherein the second saturation prevention circuit is configurable to provide a current to clamp a voltage at the output of the differential amplifier based on a gate-source voltage of the second transistor being greater than a threshold voltage.

6. The amplifier of claim 4, wherein the first saturation prevention circuit is configurable to provide a first current to clamp a voltage at the output of the differential amplifier based on a gate-source voltage of the first transistor being less than a first threshold voltage; and wherein the second saturation prevention circuit is configurable to provide a second current to clamp the voltage at the output of the differential amplifier based on the gate-source voltage of the second transistor being greater than a second threshold voltage.

7. The amplifier of claim 6, wherein the first and second threshold voltages respectively correspond to first and second levels of current that the output of the differential amplifier sinks, and the first level of current is less than the second level of current.

8. The amplifier of claim 4, wherein the third transistor is configurable so that a current through a source-drain path of the third transistor is proportional to a current through a source-drain path of the second transistor; and wherein the fourth transistor is configurable to turn on if the current through the source-drain path of the second transistor is greater than a current provided by the current source.

9. The amplifier of claim 4, wherein a source-drain path of the third transistor is included in a current path between the input of the first saturation prevention circuit and the output of the first saturation prevention circuit.

10. The amplifier of claim 1, wherein the saturation prevention circuit is a first saturation prevention circuit;

further including a second saturation prevention circuit and a ground, the second saturation prevention circuit including:

a current source including a first terminal and a second terminal, the first terminal of the current source coupled to the ground;

a third transistor including a first current terminal, a second current terminal, and a control terminal, the first current terminal of the third transistor coupled to the current terminal of the first transistor and the current terminal of the second transistor; and a fourth transistor including a first current terminal, a second current terminal, and a control terminal, the second current terminal of the fourth transistor coupled to the control terminal of the second transistor, the control terminal of the third transistor, and the output of the differential amplifier, and the first current terminal of the fourth transistor coupled to the second terminal of the current source and the second current terminal of the third transistor.

11. The amplifier of claim 10, wherein the second saturation prevention circuit is configurable to provide a current to clamp a voltage at the output of the differential amplifier based on a gate-source voltage of the second transistor being greater than a threshold voltage.

12. The amplifier of claim 10, wherein the first saturation prevention circuit is configurable to provide a first current to clamp a voltage at the output of the differential amplifier based on a gate-source voltage of the first transistor being less than a first threshold voltage; and wherein the second saturation prevention circuit is configurable to provide a second current to clamp the voltage at the output of the differential amplifier based on a gate-source voltage of the second transistor being greater than a second threshold voltage.

13. An amplifier comprising:

a first transistor including a source, a gate, and a drain;

a resistive element including a terminal;

a second transistor including a source, a gate, and a drain, the source of the second transistor coupled to the drain of the first transistor and the terminal of the resistive element;

a differential amplifier including;

a first saturation prevention circuit configurable to provide a first current to clamp a voltage at the output of the differential amplifier based on a gate-source voltage of the first transistor being less than a first threshold voltage; and a second saturation prevention circuit configurable to provide a second current to clamp the voltage at the output of the differential amplifier based on a gate-source voltage of the second transistor being greater than a second threshold voltage.

14. The amplifier of claim 13, further including a third saturation prevention circuit configurable to provide a third current to clamp the voltage at the output of the differential amplifier based on a gate-source voltage of the second transistor being less than a third threshold voltage.

15. The amplifier of claim 13, wherein the first and second threshold voltages respectively correspond to first and second levels of current that the output of the differential amplifier sinks, and the first level of current is less than the second level of current.

16. An amplifier comprising:

an input voltage terminal adapted to receive an input voltage;

an output terminal adapted to couple to a load;

a first transistor including first and second terminals and a gate, the first terminal of the first transistor coupled to the input voltage terminal;

a differential amplifier including a first input, a second input, and an output, the first input of the differential amplifier adapted to receive a reference voltage, and the second input of the differential amplifier coupled to the output terminal; and a second transistor including first and second terminals and a gate, the gate of the second transistor coupled to the output of the differential amplifier, and the first terminal of the second transistor coupled to the second terminal of the first transistor and to the output terminal;

a first saturation prevention circuit configurable to provide a first current to clamp a voltage at the output of the differential amplifier based on a gate-source voltage of the first transistor being less than a first threshold voltage; and a second saturation prevention circuit configurable to provide a second current to clamp the voltage at the output of the differential amplifier based on a gate-source voltage of the second transistor being greater than a second threshold voltage.

17. The amplifier of claim 16, further including:

a third transistor including first and second terminals and a gate, the gate of the third transistor coupled to the output of the differential amplifier and the gate of the second transistor, the third transistor configurable to conduct between its first and second terminals a third current that is proportional to a current conducted between the first and second terminals of the second transistor in response to the voltage at the output of the differential amplifier and a voltage at the output terminal; and a current source configurable to provide a fourth current;
wherein the second saturation prevention circuit is configurable to provide the second current in response to a comparison between the third current and the fourth current.

18. The amplifier of claim 16, further including a third saturation prevention circuit configurable to provide a third current to clamp the voltage at the output of the differential amplifier based on a gate-source voltage of the second transistor being less than a third threshold voltage.

19. The amplifier of claim 18, further including a third transistor including first and second terminals and a gate, the gate of the third transistor coupled to the output of the differential amplifier and the gate of the second transistor, the third transistor configurable to conduct between its first and second terminals a fourth current that is proportional to a current conducted between the first and second terminals of the second transistor in response to the voltage at the output of the differential amplifier and a voltage at the output terminal; and a current source configurable to provide a fifth current;
wherein the third saturation prevention circuit is configurable to provide the third current in response to a comparison between the fourth current and the fifth current.

20. The amplifier of claim 16, wherein the first and second threshold voltages respectively correspond to first and second levels of current that the output of the differential amplifier sinks, and the first level of current is less than the second level of current.

\* \* \* \* \*